United States Patent
Chang et al.

[11] Patent Number: 6,153,512
[45] Date of Patent: Nov. 28, 2000

[54] PROCESS TO IMPROVE ADHESION OF HSQ TO UNDERLYING MATERIALS

[75] Inventors: Chung-Long Chang, Dou-Liu; Syun-Ming Jang, Hsin-Chu, both of Taiwan

[73] Assignee: Taiwan Semiconductor Manufacturing Company, Hsin-Chu, Taiwan

[21] Appl. No.: 09/414,922

[22] Filed: Oct. 12, 1999

[51] Int. Cl.[7] .................................................. H01L 21/4763
[52] U.S. Cl. .......................... 438/624; 438/763; 438/780; 438/781; 438/782; 438/788
[58] Field of Search .................... 438/624, 763, 438/780, 781, 782, 788, 964

[56] References Cited

U.S. PATENT DOCUMENTS

| | | | |
|---|---|---|---|
| 5,310,583 | 5/1994 | Eckstein et al. | 427/575 |
| 5,334,554 | 8/1994 | Lin et al. | 437/231 |
| 5,556,806 | 9/1996 | Pan et al. | 437/195 |
| 5,818,111 | 10/1998 | Jeng et al. | 257/776 |
| 5,858,869 | 1/1999 | Chen et al. | 438/597 |
| 5,858,882 | 1/1999 | Chang et al. | 438/761 |
| 5,861,345 | 1/1999 | Chou et al. | 438/763 |
| 5,869,149 | 2/1999 | Denison et al. | 427/579 |
| 5,872,066 | 2/1999 | Fang et al. | 438/787 |
| 5,880,018 | 3/1999 | Boeck et al. | 438/619 |
| 5,883,015 | 3/1999 | Liao et al. | 438/788 |
| 5,888,309 | 3/1999 | Yu | 134/1.2 |
| 5,888,898 | 3/1999 | Ngo et al. | 438/622 |
| 5,888,911 | 3/1999 | Ngo et al. | 438/788 |
| 5,902,122 | 5/1999 | Sheen et al. | 438/224 |
| 5,970,376 | 10/1999 | Chen | 438/637 |
| 5,977,635 | 11/1999 | Tobben et al. | 257/760 |
| 6,008,540 | 12/1999 | Lu et al. | 257/758 |
| 6,030,706 | 2/2000 | Eissa et al. | 428/421 |
| 6,046,104 | 4/2000 | Kepler | 438/624 |
| 6,054,379 | 4/2000 | Yau et al. | 438/780 |
| 6,054,769 | 4/2000 | Jeng | 257/758 |
| 6,060,384 | 5/2000 | Chen et al. | 438/623 |
| 6,072,227 | 6/2000 | Yau et al. | 257/642 |
| 6,080,640 | 6/2000 | Gardner et al. | 438/455 |
| 6,083,851 | 7/2000 | Shields et al. | 438/788 |
| 6,087,724 | 7/2000 | Shields et al. | 257/734 |
| 6,100,183 | 8/2000 | Lu et al. | 438/637 |

*Primary Examiner*—Jey Tsai
*Assistant Examiner*—Lynne Gurley
*Attorney, Agent, or Firm*—George O. Saile; Stephen B. Ackerman

[57] ABSTRACT

A process for forming an intermetal dielectric, (IMD), layer, comprised of an overlying silicon oxide layer, and an underlying low k dielectric layer, such as hydrogen silsesquioxane, (HSQ), has been developed. The process features the use of a series of plasma treatments, performed in a nitrogen containing ambient, used to improve the adhesion of the IMD layer, to underlying materials. A first plasma treatment is performed on a thin insulator layer, prior to application of the HSQ layer. The plasma treatment roughens the top surface of the thin insulator layer, resulting in improved adhesion of the HSQ layer to the thin insulator layer. A second plasma treatment is performed to the HSQ layer, prior to deposition of the overlying, thick silicon oxide layer, allowing improve adhesion of the thick silicon oxide layer, to the underlying HSQ layer, to be achieved.

17 Claims, 3 Drawing Sheets

| Table 1 – IMD with & W/O $N_2$ PLasma Treatment | | | |
|---|---|---|---|
| Sample | Pull Strength (Newtons) | T/S – 200 cycles (fail/total) | T/C – 500 cycles (fail/total) |
| (A) – PEOX – HSQ – PETEOS | 190 – 225 | 3/24 | 6/32 |
| (B) First Plasma – HSQ – Second plasma – PETEOS | 220 – 250 | 0/22 | 0/32 |

Table 1 – IMD with & W/O N$_2$ Plasma Treatment

| Sample | Pull Strength (Newtons) | T/S – 200 cycles (fail/total) | T/C – 500 cycles (fail/total) |
|---|---|---|---|
| (A) – PEOX – HSQ – PETEOS | 190 – 225 | 3/24 | 6/32 |
| (B) First Plasma – HSQ – Second plasma – PETEOS | 220 – 250 | 0/22 | 0/32 |

PROCESS TO IMPROVE ADHESION OF HSQ TO UNDERLYING MATERIALS

BACKGROUND OF THE INVENTION (1) Field of the Invention

The present invention relates to methods used to fabricate semiconductor devices, and more specifically to a method used to improve the adhesion of an intermetal dielectric, (IMD), layer, such as a hydrogen silsesquioxane, (HSG), layer, to underlying insulator layers.

(2) Description of Prior Art

To improve the performance of semiconductor chips, the RC, (resistance-capacitance), value, has to be decreased. The use of copper, for metal interconnect structures, has reduced the resistance component, of the RC value, when compared to more resistive metal interconnect structures, comprised with materials such as aluminum or tungsten. In addition, capacitance decreases have been achieved via use of low dielectric constant, (low k dielectrics), materials, such as hydrogen silsesquioxane, (HSQ), featuring a dielectric constant of about 2.9. HSQ layers are used to either replace silicon oxide layers, featuring a dielectric constant of about 3.9, or to be used as a component of a composite dielectric layer, comprised with a silicon oxide layer as one of the components of the composite dielectric layer.

One scenario for the use of HSQ layers, is the application of the HSQ layer on an underlying, thin silicon oxide layer. The thin silicon oxide layer, obtained via a plasma enhanced chemical vapor deposition, (PECVD), procedure, results in the thin, plasma enhanced silicon oxide, (PEOX), layer, directly overlying, and passivating, underlying metal interconnect structures. However after application of the HSQ layer, and the deposition of another, overlying PECVD silicon oxide layer, the adhesion of the HSQ layer, to the underlying thin, PEOX layer can be marginal, and delamination of the HSQ layer, from the underlying PEOX layer, can occur.

This invention will describe a plasma treatment procedure, applied to the thin, PEOX layer, prior to the application of an HSQ, resulting in improved adhesion of the HSQ layer to the underlying thin PEOX layer, eliminating, or reducing the delamination phenomena. The plasma process described in this invention can also be performed to the underlying, thin PEOX layer, prior to the application, or deposition, of other low k dielectric layers, such as fluorinated oxide layers, or fluorinated polyamide with dielectric constants between about 2.6 to 3.5. In addition this invention will describe a combination of plasma anneal treatments, one just described, performed prior to the application of the low k dielectric layer, and a second plasma treatment, applied to the low k dielectric layer, prior to the deposition of an overlying insulator layer. Prior art, such as Sheen et al, in U.S. Pat. No. 5,902,122, describe the use of a plasma nitrogen treatment, applied to an underlying silicon oxide layer, prior to the application of a spin on glass layer. That prior art however does not offer the combination of plasma treatments, with the first applied to an underlying silicon oxide layer, prior to the application of a low k dielectric layer, such as HSQ, and with the second plasma treatment applied to the low k dielectric layer, prior to the deposition of an overlying silicon oxide layer. This series of novel plasma treatments, improve the adhesion of, and to reduce the delamination of, the thicker, low k dielectric layer, from the underlying silicon oxide layer.

SUMMARY OF THE INVENTION

It is an object of this invention to reduce the capacitance of, and to improve the performance of, semiconductor chips, via the use of low k dielectric, passivating layers.

It is another object of this invention to perform a plasma treatment, to a thin, underlying silicon oxide layer, directly overlying metal interconnect structures, prior to the application of an overlying low k dielectric material.

It is still another object of this invention to perform a nitrogen plasma treatment, after application of, or deposition of, the low k dielectric layer, prior to the application of, or the deposition of, an insulator layer, overlying the low k dielectric layer.

In accordance with the present invention a method is described for improving the adhesion of a low k dielectric layer, to an underlying silicon oxide layer, via a series of nitrogen plasma treatment, with the first treatment applied to an the underlying silicon oxide layer, prior to the low k dielectric layer application, or deposition, and with a second nitrogen plasma treatment, applied to the low k dielectric layer, prior to the application of, or the deposition of, an overlying insulator layer. After formation of metal interconnect structures, communicating with underlying conductive regions, such as an underlying metal interconnect structure, or a conductive region in the semiconductor substrate, a thin silicon oxide layer is deposited, completely contouring the metal interconnect structure. A first plasma treatment is performed, in a nitrogen ambient, densifying, or roughening, the top surface of the thin silicon oxide layer. A low k dielectric layer, such as HSQ is applied, completely covering the top surface of the plasma treated, silicon oxide layer. A second plasma treatment, applied to the exposed top surface of the low k dielectric layer, is then performed, again in a nitrogen plasma, followed by the application of, or the deposition of, an overlying, thick silicon oxide layer.

BRIEF DESCRIPTION OF THE DRAWINGS

The object and other advantages of this invention are best described in the preferred embodiments with reference to the attached drawings, and tables, that include:

FIG. 5, which shows Table 1, depicting the results of adhesion and delamination tests, performed to samples prepared with, and without, the plasma nitrogen treatments, applied to the underlying silicon oxide layer, prior to application of, or deposition of, the low k dielectric layer, and applied to the low k dielectric layer, prior to application of, or deposition of, an overlying insulator layer.

DESCRIPTION OF THE PREFERRED EMBODIMENTS.

Figure 1:
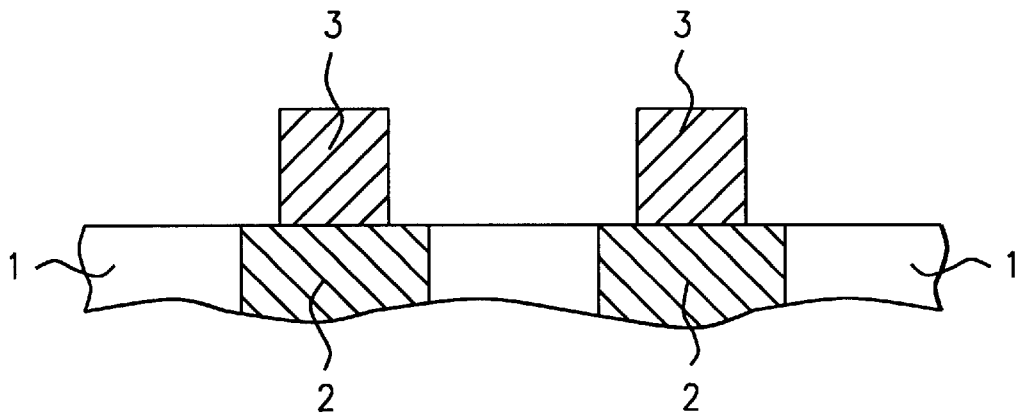
FIGS. 1–4, which schematically, in cross-sectional style, describe key stages of fabrication used to form a low k dielectric layer, on an underlying, thin silicon oxide layer, featuring a series of nitrogen plasma treatment, applied before, and after, the application, or deposition of, the low k dielectric layer.

The method of forming a low k dielectric layer, with improved adhesion to an underlying insulator layer, featuring a series of nitrogen plasma treatments, performed prior to application of the low k dielectric layer, and prior to application, or deposition, of an insulator layer, overlying the low k dielectric layer, will now be described in detail. An underlying conductive region 2, comprised of either a metal interconnect structure, or a conductive, or active device region in a semiconductor substrate, encased in insulator layer 1, is schematically shown in FIG. 1 An overlying metal interconnect structure 3, comprised of a metal chosen from a group that includes aluminum, tungsten, or copper, is formed overlying, and contacting, underlying conductive regions 2. Metal interconnect structures 3, are formed via deposition of a metal layer, via either plasma vapor deposition, (PVD), or chemical vapor deposition, (CVD), procedures, at a thickness between about 150 to 1000 Angstroms. If copper is used for metal interconnect structures 3, underlying, and overlying, titanium nitride barrier layers, are used. Conventional photolithographic and reactive ion etching procedures, using $Cl_2$, or $BCl_3$ as an etchant, are used to pattern the metal layer, forming metal interconnect structures 3, schematically shown in FIG. 1. The photoresist shape used for definition of metal interconnect structures 3, is removed via plasma oxygen ashing and careful wet cleans.

Figure 2:
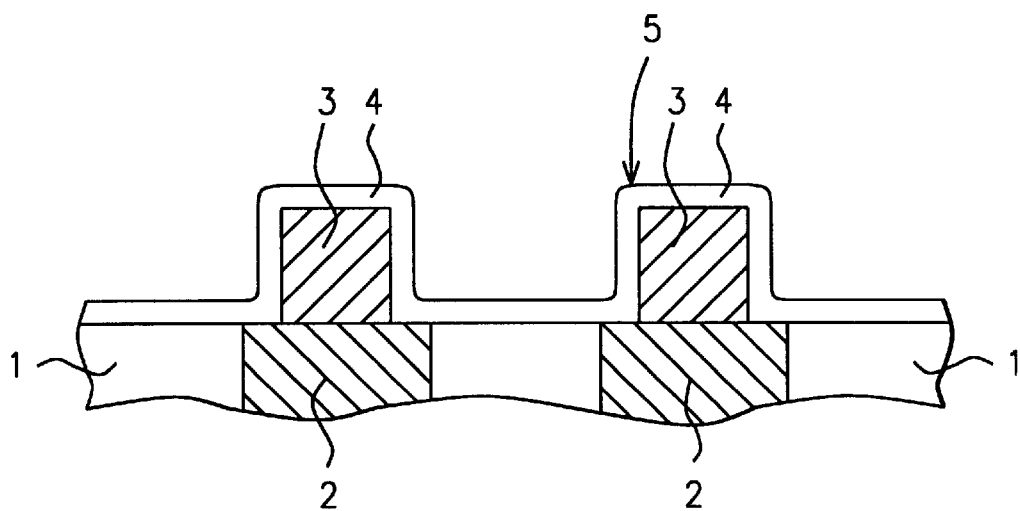

A thin insulator layer 4, comprised of either: PEOX, a silicon oxide layer obtained via a plasma enhanced chemical vapor deposition, (PECVD), procedure; a silicon oxynitride layer, (SiON), obtained via low pressure chemical vapor deposition, (LPCVD), or PECVD procedures, or a silicon nitride layer, obtained via LPCVD or PECVD procedures, is next deposited, conformally contouring metal interconnect structures 3. Thin insulator 4, schematically shown in FIG. 2, is deposited to a thickness between about 450 to 550 Angstroms. The top surface of thin insulator layer 4, can however be too smooth to allow adequate adhesion to an overlying low k dielectric layer, therefore a first plasma treatment is performed, creating a roughened, or densified, top surface 5, for thin insulator 4. The first plasma treatment is performed in either a nitrogen, or $N_2O$ ambient, either in situ, in the same chamber used for deposition of thin insulator layer 4. The first plasma treatment can also be performed in a system, or tool, other then the apparatus used for deposition of thin insulator layer 4. The first plasma treatment is performed at a temperature between about 340 to 410° C., at a pressure between about 3 to 20 torr, with a nitrogen, or $N_2O$ flow between about 1000 to 2000 SLM, at an R.F. power between about 100 to 250 watts, at a frequency between about 350 KHz to 13.56 MHz.

Figure 3:
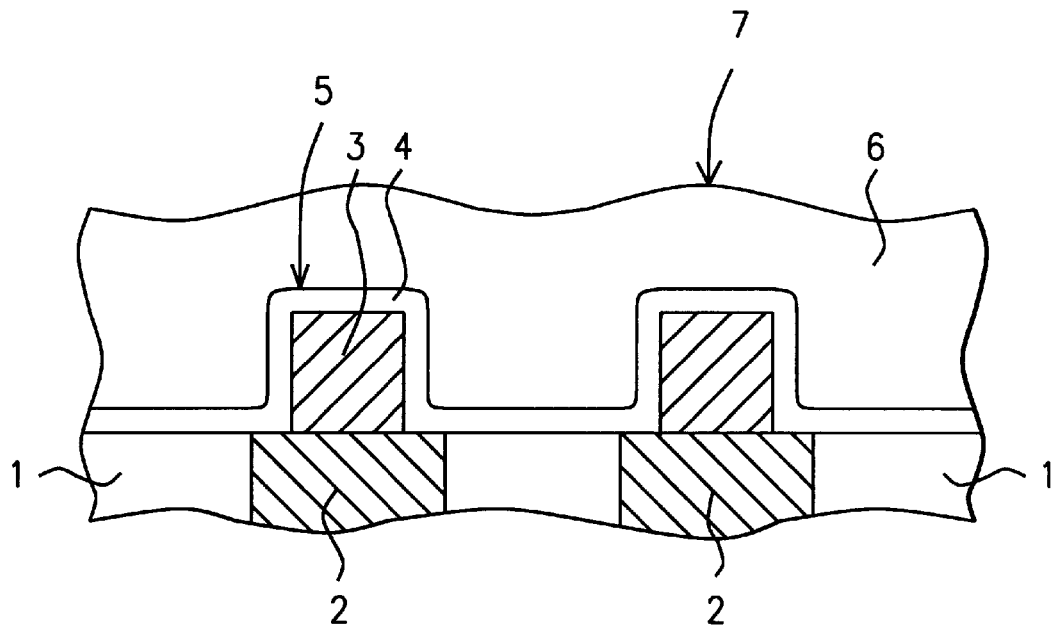

FIG. 3, schematically shows the application of, or the deposition of, low k dielectric layer 6. Low k dielectric layer 6, can be an HSQ layer, applied via spin on techniques, at a thickness between about 3000 to 5000 Angstroms, overlying roughened surface 5, of thin insulator layer 4. The dielectric constant of the HSQ layer is between about 2.8 to 3.0. Other low k dielectric layers, such as fluorinated oxides, or fluorinated silicon oxide glass, (FSG), can also be used to overlay roughened surface 5, with the FSG layer obtained via CVD procedures. Although the adhesion of the low k dielectric layer 6, to underlying thin insulator layer 4, has been improved via creation of roughened surface 5, obtained using the first plasma treatment, adhesion of an overlying insulator layer to the smooth top surface of low k dielectric layer 6, can be marginal. Therefore a second plasma treatment, is performed, creating a roughened top surface 7, for low k dielectric layer 6. The second plasma treatment is again performed in a nitrogen, or $N_2O$ ambient, at a temperature between about 340 to 410° C., using a flow between about 1000 to 2000 SLM, at an R.F. power between about 3 to 20 watts, at an R.F. frequency between about 350 KHz to 13.56 MHz.

Figure 4:
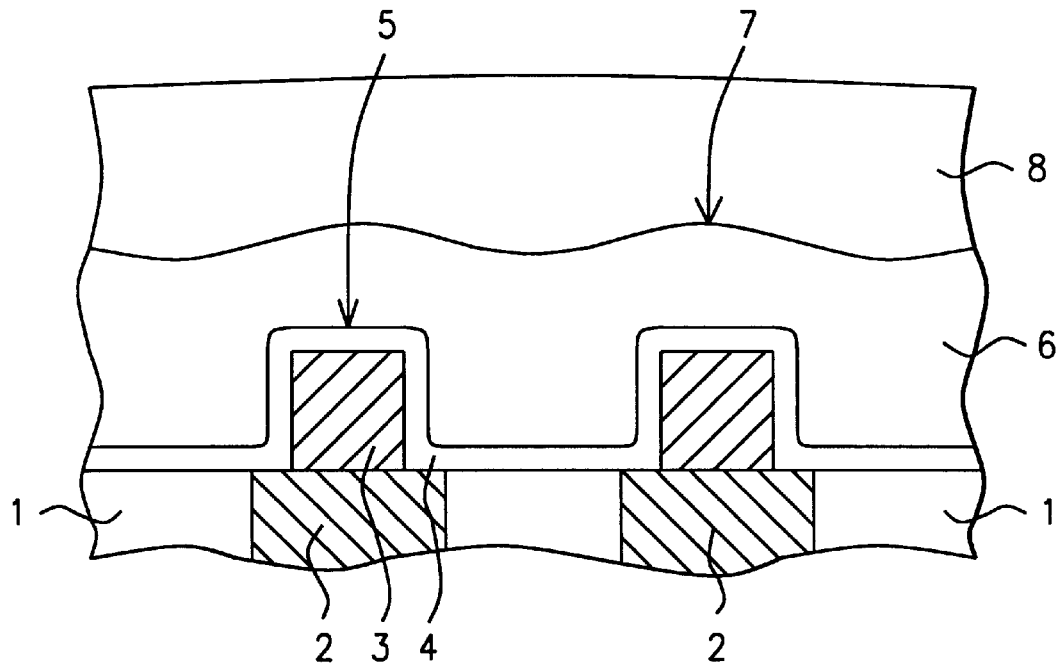

Insulator layer 8, comprised of silicon oxide, obtained via PECVD procedures, at a thickness between about 12000 to 19000 Angstroms, using tetraethylorthosilicate, (TEOS), as a source, is next deposited, and schematically shown in FIG. 4. The adhesion of insulator layer 8, to underlying low k dielectric layer 6, has been improved as a result of the second plasma treatment.

The results of a series of tests, performed to monitor the adhesion of the composite insulator layer, comprised of insulator layer 8, and low k dielectric layer 6, to underlying thin insulator layer 4, is summarized in Table 1, shown in FIG. 5. Composite insulator samples A, formed without plasma treatments, indicated pull strengths between about 190 to 225 Newtons, compared to counterpart, composite insulator samples B, formed using a first plasma treatment, prior to HSQ application, and formed using a second plasma treatment, applied prior to deposition of insulator layer 8, indicated improved pull strengths between about 220 to 250 Newtons. In addition, thermal stressing, (T/S), and pressure cooker testing, (T/C), resulted in 3 of 24 of samples A, failing the T/S test, while 6 of 32 samples failed the T/C test. In contrast none of samples B, formed using the combination of plasma treatments, described in this invention, failed either the T/S or the T/C stressing.

While this invention has been particularly shown and described with reference to, the preferred embodiments thereof, it will be understood by those skilled in the art that various changes in form and details may be made without departing from the spirit or scope of this invention.

What is claimed is:

1. A method of forming an intermetal dielectric, (IMD), layer, on a semiconductor substrate, comprising the steps of:
    providing metal interconnect structures, overlying, and contacting, underlying conductive regions;
    forming a thin insulator layer on said metal interconnect structures;
    performing a first plasma treatment on said thin insulator layer;
    applying a low k dielectric layer from the group consisting of one of hydrogen silsesquioxane (HSQ) and fluorinated silicon oxide (FSG) on the top surface of the plasma treated, said thin insulator layer;
    performing a second plasma treatment on said low k dielectric layer; and
    depositing a thick insulator layer, on the plasma treated, said low k dielectric layer, to form a composite, IMD layer, comprised of underlying, said low k dielectric layer, and overlying, said thick insulator layer.

2. The method of claim 1, wherein said metal interconnect structure is comprised of a metal chosen from a group that contains aluminum, tungsten, or copper.

3. The method of claim 1, wherein said thin insulator layer is a silicon oxide layer, obtained via PECVD procedures, to a thickness between about 450 to 550 Angstroms.

4. The method of claim 1, wherein said thin insulator layer is a silicon oxynitride layer, or a silicon nitride layer, obtained via PECVD or LPCVD procedures, at a thickness between about 450 to 550 Angstroms.

5. The method of claim 1, wherein said first plasma treatment is performed in a nitrogen, or a $N_2O$ ambient, at a temperature between about 340 to 410° C., at a pressure between about 3 to 20 torr, at an R.F. power between about 100 to 250 watts, at an R.F. frequency between about 350 KHz to 13.56 MHz, and using a flow rate of nitrogen or $N_2O$, between about 1000 to 2000 SLM.

6. The method of claim 1, wherein said low k dielectric layer, is a hydrogen silsesquioxane, (HSQ), layer, applied via spin on procedures, to a thickness between about 3000 to 5000 Angstroms, with a dielectric constant between about 2.8 to 3.0.

7. The method of claim 1, wherein said low k dielectric layer is a fluorinated silicon oxide layer, (FSG), obtained via CVD procedures to a thickness between about 4000 to 17000 Angstroms.

8. The method of claim 1, wherein said second plasma treatment is performed in a nitrogen or $N_2O$ ambient, at a temperature between about 340 to 410° C., at a pressure between about 3 to 20 torr, at a R.F. power between about 100 to 250 watts, at a R.F. frequency between about 350 KHz to 13.56 MHz., and using a nitrogen or $N_2O$ flow rate between about 1000 to 2000 SLM.

9. The method of claim 1, wherein said thick insulator layer is a silicon oxide layer, obtained via PECVD procedures, to a thickness between about 12000 to 19000 Angstroms, using tetraethylorthosilicate, (TEOS), as a source.

10. A method of forming an IMD layer, on a semiconductor substrate, using a series of plasma treatments, in a nitrogen containing ambient, to improve the adhesion of said IMD layer, to said semiconductor substrate, comprising the steps of:

provic metal interconnect structures, overlying, and contacting, underlying conductive regions;

depositing a thin silicon oxide layer, completely contouring said metal interconnect structures;

performing a first plasma treatment, in a nitrogen containing ambient, resulting in a roughened top surface for said thin silicon oxide layer;

applying a hydrogen silsesquioxane, (HSQ), layer, on the roughened top surface of said thin silicon oxide layer;

performing a second plasma treatment, in a nitrogen containing ambient, creating a roughened top surface of said HSQ layer; and depositing a thick silicon oxide layer, on the roughened top surface of said HSQ layer, resulting in said IMD layer, comprised of said thick silicon oxide layer, and said HSQ layer, overlying the roughened top surface of said thin silicon oxide layer.

11. The method of claim 10, wherein said conductive regions are either lower level, metal interconnect structures, or active device regions, in said semiconductor substrate.

12. The method of claim 10, wherein said metal interconnect structures are comprised of a metal chosen from a group that includes aluminum, tungsten, or copper.

13. The method of claim 10, wherein said thin silicon oxide layer is obtained via PECVD procedures, at a thickness between about 450 to 550 Angstroms.

14. The method of claim 10, wherein said first plasma treatment is performed in a nitrogen or $N_2O$ ambient, at a temperature between about 340 to 410° C., at a pressure between about 3 to 20 torr, at an R.F. power between about 100 to 250 watts, at an R.F. frequency between about 350 KHz to 13.56 MHz, and at a nitrogen or $N_2O$ flow of between about 1000 to 2000 SLM.

15. The method of claim 10, wherein said HSQ layer is applied via a spin on procedure, to a thickness between about 3000 to 5000 Angstroms, featuring a dielectric constant between about 2.8 to 3.0.

16. The method of claim 10, wherein said second plasma treatment is performed in a nitrogen or $N_2O$ ambient, at a temperature between about 340 to 410° C., at a pressure between about 3 to 20 torr, at an R.F. power between about 100 to 250 watts, at an R.F. frequency between about 350 KHz to 13.56 MHz, and using a flow of nitrogen, or $N_2O$, between about 1000 to 2000 SLM.

17. The method of claim 10, wherein said thick silicon oxide layer is obtained via PECVD procedures, to a thickness between about 12000 to 19000 Angstroms, using TEOS as a source.

* * * * *